United States Patent
Chiang et al.

[11] Patent Number: 6,025,279
[45] Date of Patent: Feb. 15, 2000

[54] METHOD OF REDUCING NITRIDE AND OXIDE PEELING AFTER PLANARIZATION USING AN ANNEAL

[75] Inventors: Min-Hsiung Chiang, Pan-Chiao; Chen-Jong Wang; Jenn Ming Huang, both of Hsin-Chu, all of Taiwan

[73] Assignee: Taiwan Semiconductor Manufacturing Company, Hsin-Chu, Taiwan

[21] Appl. No.: 09/086,824

[22] Filed: May 29, 1998

[51] Int. Cl.[7] .................................................. H01L 21/02
[52] U.S. Cl. .......................... 438/760; 438/763; 438/781; 438/783; 438/791
[58] Field of Search .................................... 438/113, 114, 438/760, 761, 691, 692, 783, 781, 780, 782, 795, 791

[56] References Cited

U.S. PATENT DOCUMENTS

| | | | |
|---|---|---|---|
| 5,296,411 | 3/1994 | Gardner et al. | 437/238 |
| 5,334,554 | 8/1994 | Lin et al. | 437/231 |
| 5,474,955 | 12/1995 | Thakur | 437/173 |
| 5,494,857 | 2/1996 | Cooperman et al. | 437/228 |
| 5,635,425 | 6/1997 | Chen | 438/631 |
| 5,780,364 | 7/1998 | Thakur | 438/775 |
| 5,880,039 | 3/1999 | Lee | 438/763 |

*Primary Examiner*—Chandra Chaudhari
*Assistant Examiner*—Pham Thanhha
*Attorney, Agent, or Firm*—George O. Saile; Stephen B. Ackerman; William J. Stoffel

[57] ABSTRACT

A method of rapid thermal annealing (RTA) a TEOS oxide layer 50 that underlies a silicon nitride stop layer 60. The RTA of the TEOS-Oxide ILD layer 50 prevents the nitride stop layer 60 and oxide ILD layer 50 from peeling in subsequent thermal steps. The process comprises providing a semiconductor structure 10 with an uneven surface; forming an interlevel dielectric layer 50 composed of PE-TEOS oxide over the structure 10; rapid thermal annealing (RTA) the third interlevel dielectric layer 50 at a temperature between about 850 and 1015° C. for a time between about 10 and 50 seconds; depositing a silicon nitride layer 60 over the third interlevel dielectric layer 50; and planarizing the silicon nitride layer 60 and the third interlevel dielectric layer 50.

19 Claims, 2 Drawing Sheets

METHOD OF REDUCING NITRIDE AND OXIDE PEELING AFTER PLANARIZATION USING AN ANNEAL

BACKGROUND OF INVENTION

1. Field of the Invention

This invention relates to a method of fabricating semiconductor devices and more specifically to annealing process of an oxide layer for use during the fabrication of semiconductor devices and more particularly to a post annealing process for an oxide layer formed using TEOS followed by a chemical-mechanical polish process or etch back process.

2. Description of the Prior Art

Very Large Scale Integrated (VLSI) and Ultra Large Scale Integration (ULSI) circuits utilize a variety of devices having different feature sizes or device dimensions. Such devices include, but are not limited to, transistors, diodes, capacitors, resistors and wires. The minimum state of the art device dimensions have shrunk to the submicron level.

Some devices may have submicron feature sizes while others may simultaneously have much greater feature sizes. Shallow trenches of constant height and varying widths are used to isolate individual devices. These trench widths can vary greatly. These trenches are typically filled with a dielectric material, such as silicon oxide. Because of the complex topography, especially when shallow trenches of greatly varying widths are used, a problem often encountered is achieving a uniform oxide fill, in those trenches, independent of trench size and device density.

In addition, steps, trenches and other topography changes occur across the wafer in scribe areas and near the wafer edges. For such VLSI and ULSI circuits, topology management during fabrication has become a critical process step.

As feature sizes or device dimensions are scaled downward, more stringent requirements on deposition, photo, and etching processing are posed. Surface-clearing planarization processes, such as are used to create oxide-filled trench isolation, often require that the planarized material thickness be controlled to within a very tight tolerance. When simultaneously achieved over all topographies this condition is referred to as "global" planarization. As compared to conventional Local Oxidation of Silicon (LOCOS) isolation, shallow trench isolation (STI) offers improved isolation between devices and greater packing density. Additionally STI offers a higher degree of planarity, which becomes increasingly important as the photolithographic depth of focus budget continues to shrink with decreasing minimum line width.

A common method for planarizing steps in surface topology is a chemical-mechanical polish (CMP) process. This CMP process sequence is as follows. The isolation trenches are patterned onto a Semiconductor wafer or substrate, generally a silicon substrate. Oxide is deposited conformally onto the wafer with patterned trenches. CMP is used to polish the oxide back to the silicon nitride that caps the active area mesas.

However, the inventor has found that a problem exists in forming the Silicon nitride (SiN) chemical-mechanical polish (CMP) stop layers. After the CMP step, some silicon nitride (SiN) remains (called SiN residues) occur in certain areas of the wafer, such as near the scribe line, wafer edge and peripheral area. The silicon nitride and oxide in these areas will peel after subsequent thermal steps and will cause particle contamination. These particles degrade product yields by degrading subsequent photoresist coating processes. If the peeling regions occur cross contact areas, they will cause contact failure which will decrease the yield.

The importance of overcoming the various deficiencies noted above is evidenced by the extensive technological development directed to the subject, as documented by the relevant patent and technical literature. The closest and apparently more relevant technical developments in the patent literature can be gleaned by considering the following U.S. patents. U.S. Pat. No. 5,494,857 (Cooperman) shows a method of chemical-mechanical polishing (CMP) using a silicon nitride stopper layer. U.S. Pat. No. 5,334,554 (Lin) shows a method of using a nitrogen plasma treatment on dielectric layers. U.S. Pat. No. 5,296,411 (Gardner) shows a $N_2$ anneal for a tunnel oxide. U.S. Pat. No. 5,635,425 (Chen) shows a $N_2$ Plasma treatment for BPSG and PSG layers prior to the TEOS-Oxide deposition. U.S. Pat. No. 5,474,955 (Thakur) shows a method of annealing an oxide layer.

Accordingly, although various improvements in planarization techniques have been developed, manufacturability problems still exist related to the peeling of the silicon nitride (SIN) planarization stop layer and oxide layer.

SUMMARY OF THE INVENTION

It is an object of the present invention to provide a method for fabricating global planarizing the surface of a wafer and preventing a silicon nitride planarization stop layer from peeling.

It is an object of the present invention to provide a method for rapid thermal annealing a PE-TEOS oxide layer prior to SiN deposition and chemical-mechanical polish/etch back planarization.

To accomplish the above objectives, the present invention provides a method of rapid thermal annealing a TEOS oxide layer 50 that underlies a Silicon nitride planarization stop layer 60 (e.g., buffer layer). The rapid thermal anneal (RTA) of the TEOS-Oxide layer 40 prevents the SIN CMP stop layer 50 from peeling in subsequent thermal steps. The process is begins by:

a) providing a semiconductor structure 10 Having at least a cell area 12 and a peripheral area 14;

b) forming a first interlevel dielectric layer 30 over the semiconductor structure 10, the first interlevel dielectric layer 30 formed using a plasma enhanced chemical vapor deposition (PECVD) process with TetraEthylOrthoSilane (TEOS) having a thickness in a range of between about 500 and 2000 Å;

c) forming a second interlevel dielectric layer 40 using a plasma enhanced chemical vapor deposition (PECVD) process with TetraEthylOrthoSilane (TEOS) having a thickness in a range of between about 1000 and 4000 Å;

d) forming a third interlevel dielectric layer 50 composed of oxide using a plasma enhanced chemical vapor deposition (PECVD) process using an organometallic source;

e) rapid thermal annealing the third interlevel dielectric layer 50 at a temperature in a range of between about 850 and 1015° C. for a time in a range of between about 10 and 50 seconds;

f) depositing a silicon nitride layer 60 over the third interlevel dielectric layer 50, the silicon nitride layer 60 formed using a plasma enhanced chemical vapor deposition process; and g) planarizing the silicon nitride layer 60 and the third interlevel dielectric layer 50 so to remove portions of the silicon nitride layer 60 and the third interlevel dielectric layer; the planarization of the silicon nitride layer 60 and the third interlevel dielectric layer 50 is by chemical-mechanical polishing or etching back.

The present invention provides an anneal for a TEOS-oxide interlevel dielectric layer 50 that prevents the SiN CMP stop layer 60 and the PE-TEOS interlevel dielectric layer 50 from peeling during subsequent thermal processes. The invention prevents SiN peeling certain areas of the wafer where the residual SiN layer 60 remains after the planarization process, such as near the scribe line, wafer edge and peripheral areas. The invention improves product yields by preventing the SiN 60 peeling that degrade subsequent photoresist coating processes. It is not necessary to remove all of the SiN layer 60 after the planarization process because the invention's RTA step will eliminate the SiN peeling.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
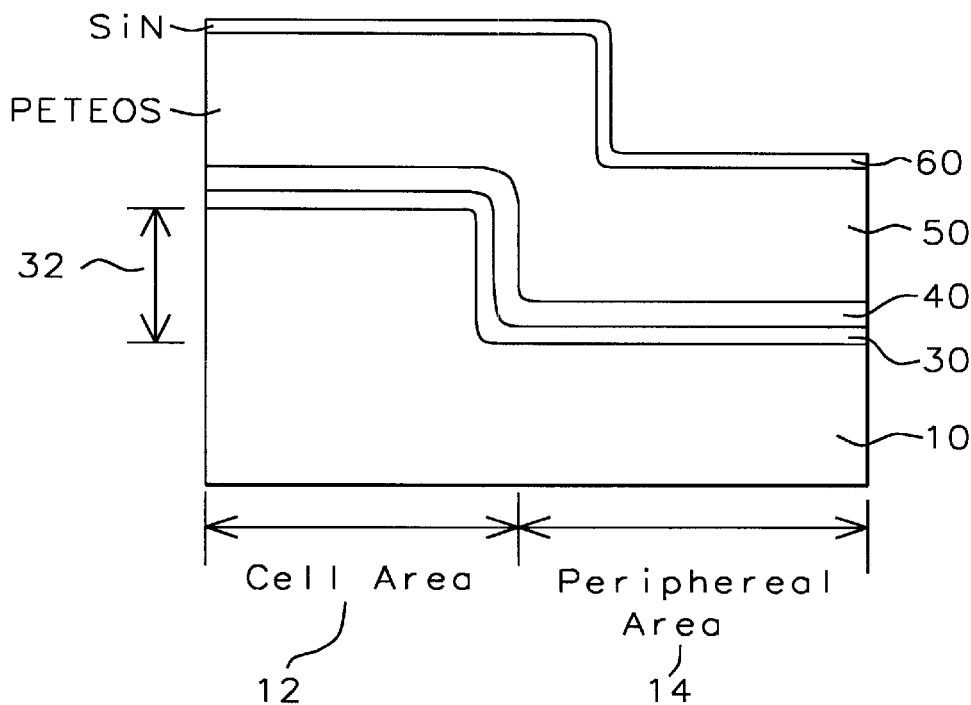
FIGS. 1 and 2 are cross sectional views for illustrating a method for global planarizing insulating (ILD) layer surfaces according to the present invention.

The present invention will be described in detail with reference to the accompanying drawings. The present invention provides a method of forming a silicon nitride CMP stop layer over a silicon oxide layer 50 formed by a TEOS process. The TEOS oxide layer 50 is rapid thermal annealed then the silicon nitride (SiN) stop layer 60 is formed thereover. Unexpectedly, the rapid thermal anneal (RTA) of the oxide layer 50 prevents the SIN layer 60 from peeling during subsequent thermal processes and CMP processes.

It should be recognized that many publications describe the details of common techniques used in the fabrication process of integrate circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

The table below summaries many of the important elements of the invention.

| Element NO. | generic name | Remarks-preferred parameters |
|---|---|---|
| 10 | semiconductor structures | top layer preferably TEOS oxide (IPO) |
| 30 | first interlayer dielectric layer | PETEOS ILD layer |
| 40 | second interlayer dielectric layer | BPTEOS |
| 50 | third interlayer dielectric layer - or interlevel interlayer dielectric (IDL) | oxide formed using an organosilicon source (e.g., PETEOS) |
| 60 | first silicon nitride stop layer | PE- SiN |
| 70 | Sacrificial layer | SOG, photoresist or other material |

The invention begins by providing a semiconductor structure 10 with a cell area 12 and peripheral areas 14. The cell areas can comprise the areas where semiconductor devices, e.g., transistors, are formed. The peripheral areas 14 can comprises areas such as wafer scribe area, wafer edges, and other places where there is no pattern or devices on the chip.

The top surface of the semiconductor structure in the peripheral areas 14 is lower than the top surface in the cell areas 12. This is an example of uneven topography that planarization processes are used to create smooth level surfaces. Other uneven surfaces are possible, and this figure is not meant to limit the application of the invention. This step 32 preferably has a height in a range of between about 6000 and 10,000 Å and more preferably between 8000 and 8500 Å.

Semiconductor structure 10 is understood to possibly include a semiconductor wafer, active and passive devices formed within/on the wafer (such as transistors) and conductive and insulating layers formed on the wafer surface. The semiconductor structure preferably has a top dielectric layer composed of an insulating material.

Next, a first interlevel dielectric layer 30 (optional layer) is preferably formed over the semiconductor structure. The first interlevel dielectric layer 30 is preferably formed using a plasma enhanced chemical vapor deposition (PECVD) process with TetraEthylOrthoSilane (TEOS) having a thickness in a range of between about 500 and 2000 Å. The first interlevel dielectric layer can be part of the semiconductor structure 12.

Following this a second interlevel dielectric layer 40 (optional layer) is formed over the first ILD layer 30. The second interlevel dielectric layer (ILD) 40 is preferably composed of a doped oxide, PSG, BSG or borophosphosilicate glass (BPSG), and most preferably composed of borophosphosilicate glass formed by a TEOS process (BP-TEOS). The second ILD layer 30 is preferably formed using a plasma enhanced chemical vapor deposition (PECVD) process with TetraEthylOrthoSilane (TEOS) having a thickness in a range of between about 1000 and 4000 Å (1000 Å).

Still referring to FIG. 1, in an important step, a third interlevel dielectric (ILD) layer 50 is formed over the resultant surface. The third interlevel dielectric (ILD) layer 50 is composed of a silicon oxide. The third ILD layer 50 is preferably formed using a plasma enhanced chemical vapor deposition (PECVD) process using an organosilicon (e.g., organometallic source. The source is preferably TetraEthOxySilane or TetraEthylorthoSilicate (TEOS) or TetraMethyl- CycloTraSiloxane (TMCTS) and most preferably TEOS. The third ILD layer 50 preferably has a thickness in a range of between about 8000 and 12,000 Å (tgt=10,000 Å).

Methods that can be used to form the third ILD layer 50 are described by C. Y. Chang, S. M. Sze, in *ULSI Technology*, by The McGraw-Hill Company, Inc. copyright 1997 pp. 164 to 167.

In an important step, the third interlevel dielectric layer 50 is annealed or rapid thermal annealed (RTA). The preferred RTA process is performed at a temperature in a range of between about 850 and 1015° C. for a time in a range of between about 10 and 50 seconds. This anneal prevents the SiN layer 60 from peeling.

Next, a stop layer (e.g., silicon nitride layer) 60 is deposited over the third interlevel dielectric layer 50. The silicon nitride layer 60 is preferably formed using a plasma enhanced chemical vapor deposition process. Layer 60 could also be a HUSG layer but its uniformity of global wafer CMP is not better than SiN layer. The stop layer 60 is formed of a material that has a lower CMP or etch back rate than IDL layer 50.

Next, the nitride layer 60 and the interlevel dielectric layer 50 are planarized. The planarization is preferably a chemical-mechanical polish or an etch back process.

Figure 2:
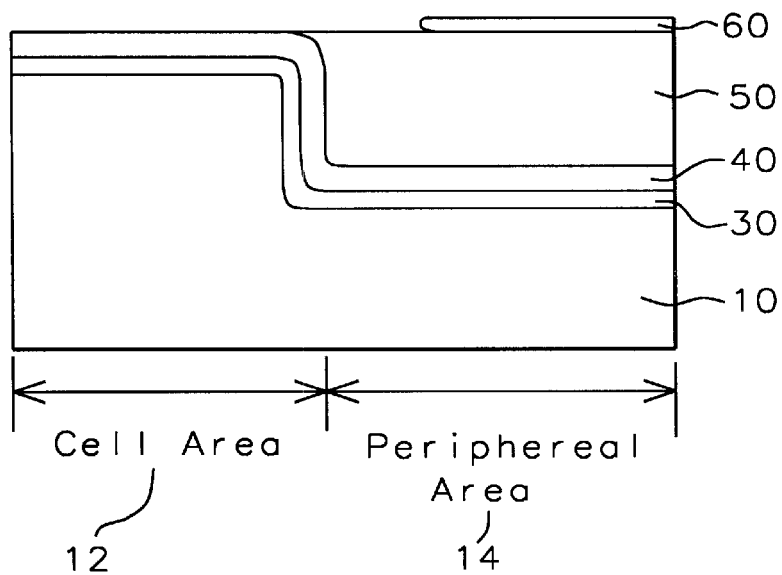

FIG. 2 shows the result after the planarization process where portions of the nitride layer 60 remain (silicon nitride residue) over some areas of the interlevel dielectric layer 50.

As shown in FIG. 2, the silicon nitride layer 60 and the third interlevel dielectric layer 50 are planarized (e.g., chemical-mechanical polished or etch back) so that the planarization removes portions the SiN Layer 60 and third interlevel dielectric layer over the cell area 12. Normally, the CMP step doesn't remove all the SiN layer 60 over the structure 12 due to the chemical-mechanical polish/etch back uniformity considerations. Some SiN layer is left in the peripheral areas to achieve the maximum global planarization. Therefore, under normal condition a residual SiN layer 60 remains over portions of the ILD layer 50.

Figure 3:
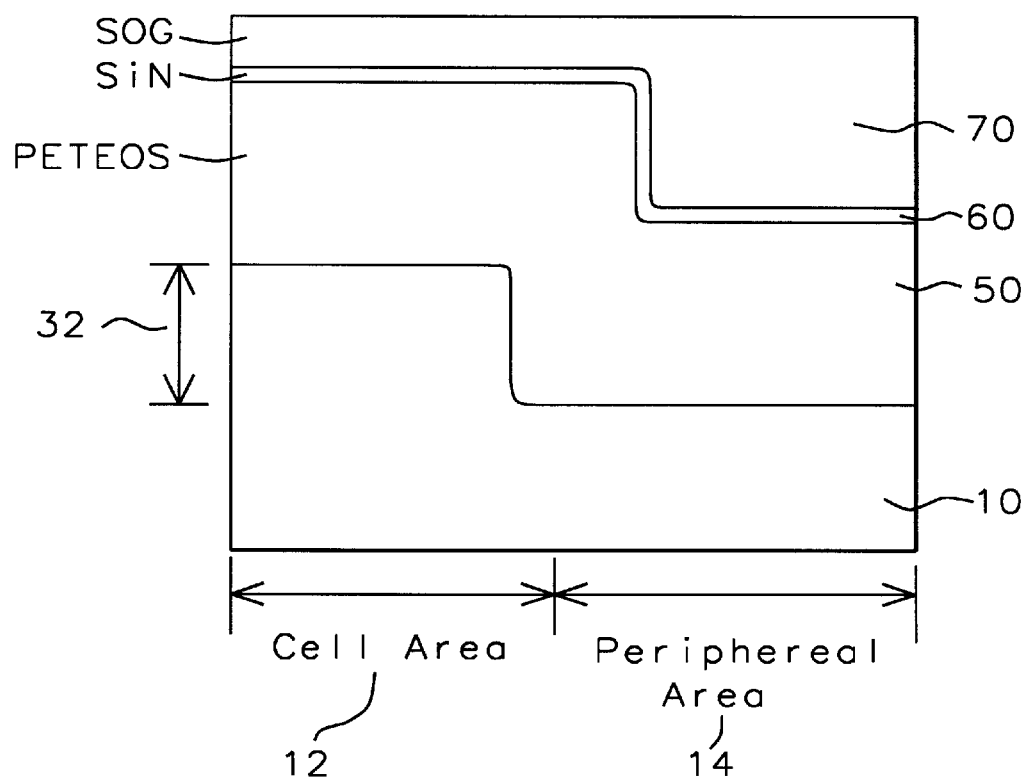
FIG. 3 is a cross sectional view for illustrating a method for global planarizing an interlevel dielectric layer 50 surfaces using an etch back process with a sacrificial layer 70 according to the present invention.

FIG. 3 shows an alternate planarization process where a sacrificial layer 70 is formed over the silicon nitride layer 60. The sacrificial layer 70 can be composed of spin-on-glass or photoresist. Next, the sacrificial layer, nitride layer 60 and the interlevel dielectric layer 50 are etched back. The result is illustrated in FIG. 2 where portions of the SiN layer 60 remain over the IDL layer 50.

Next, the third interlevel dielectric layer 50, the silicon nitride layer 60 and the second interlevel dielectric layer 40 are cleaned. The layers are preferably cleaned by APM ($NH_4OH$) and DI Water rinse.

Subsequently, normal processing is performed where the dielectric layers and conductive layer are formed thereover to complete a semiconductor device.

The major steps of the invention area shown below:

SUMMARY TABLE

| Main Steps of the invention | Comments |
| --- | --- |
| forming a third interlevel dielectric layer 50 using an organosilicon sources (e.g., PE-TEOS) | Layer 50 is porous and non-dense oxide because of the gas ratio. |
| RTA the third interlevel dielectric layer 50 at a T between about 850 and 1015° C. for a time between 10 and 50 sec. | Key RTA step to densifiy the oxide layer 50 and to prevent outgassing and peeling in subsequent heat cycles. |
| depositing a silicon nitride layer | |

SUMMARY TABLE-continued

| Main Steps of the invention | Comments |
| --- | --- |
| 60 over the third interlevel dielectric layer 50 | |
| Planarizing (CMP or etch back) the silicon nitride layer 60 and the third interlevel dielectric layer 50 | |
| cleaning third interlevel dielectric layer 50, the silicon nitride layer 60 and the second interlevel dielectric layer 40; | |
| continue processes where the anneal of the invention prevent SIN layer 60 and ILD layer 50 peeling. | |

The present invention provides a RTA TEOS-oxide process that prevents the SIN stop layer 60 from peeling during subsequent thermal processes. The invention prevents SiN peeling and TEOS oxide layer 50 peeling from occurring in non-patterned areas of the wafer, such as near the scribe line, wafer edge and peripheral areas. The invention improves product yields by preventing the particles that would have degraded subsequent photoresist coating processes.

The inventor has theorized that the SiN stop layer 60 peeling problem occurs by the following mechanism. The PETEOS layer 50 is porous and non-dense. If the nitride 60 is left over the PETEOS layer 50 (residual nitride) then the nitride will suppress the outgassing from the PETEOS layer 50 during subsequent anneal processes. An unstable state occurs between the oxide regions 50 with and without the nitride layer 60. Peeling of the nitride 60 and the PETEOS oxide layer 50 occurs in these regions.

The inventor determined using SEM analysis that chemicals out gas from the un-annealed porous oxide layer 50 during subsequent heat cycles. However, the identity of the chemicals could not be determined. Experiments showed that the TEOS oxide layer 50 becomes more stable and dense after invention's RTA Treatment, especially in the temperature range between about 850° C. to 1015° C.

While the invention has been particularly shown and described with reference to the preferred embodiments thereof, it will be understood by those skilled in the art that various changes in form and details may be made without departing from the spirit and scope of the invention.

What is claimed is:

1. A method of annealing an oxide layer to prevent peeling of an overlying silicon nitride layer after a planarization process, comprising:

a) providing a semiconductor structure with at least a cell area and a peripheral area;

b) forming an interlevel dielectric layer composed of oxide, using an organosilicon source, over said semiconductor structure;

c) annealing said interlevel dielectric layer;

d) depositing a silicon nitride layer over said interlevel dielectric layer;

e) planarizing said silicon nitride layer and said interlevel dielectric layer so to remove portions of said silicon nitride layer and said interlevel dielectric layer whereby the anneal prevents said silicon nitride layer and said interlevel dielectric layer from peeling.

2. The method of claim 1 which further includes before step (b) the following:

a) forming a first interlevel dielectric layer on said semiconductor structure, said first interlevel dielectric layer formed using a plasma enhanced chemical vapor deposition (PECVD) process with TetraEthylOrthoSilane (TEOS) having a thickness in a range of between about 500 and 2000 Å;

b) forming a second interlevel dielectric layer using a plasma enhanced chemical vapor deposition (PECVD) process with TetraEthylOrthoSilane (TEOS) having a thickness in a range of between about 1000 and 4000 Å; and c) step (b) of claim 1 further includes forming said interlevel dielectric layer on said second dielectric layer.

3. The method of claim 1 wherein said peripheral area comprises an area selected from the group consisting of a wafer scribe area, a wafer edge, and a non-patterned area.

4. The method of claim 1 wherein said interlevel dielectric layer is formed using an organosilicon source and having a thickness in a range of between about 8000 and 12,000 Å.

5. The method of claim 1 wherein said organosilicon source comprises a material selected from the group consisting of TetraEthOxySilane, TetraEthylorthoSilicate, and TetraMethylCycloTraSiloxane (TMCTS).

6. The method of claim 1 wherein the annealing of said interlevel dielectric layer is a rapid thermal anneal at a temperature at a range of between about 850 and 1015° C. for a time in a range of between about 10 and 50 seconds.

7. The method of claim 1 wherein said silicon nitride layer is formed using a plasma enhanced chemical vapor deposition process.

8. The method of claim 1 wherein the planarization of said silicon nitride layer and said interlevel dielectric layer is a process selected from the group consisting of chemical-mechanical polish and etch back.

9. The method of claim 1 wherein the planarization of said silicon nitride layer and said interlevel dielectric layer comprises:

a) forming a sacrificial layer composed of spin-on-glass over said silicon nitride layer; and b) etching back said sacrificial layer and said silicon nitride layer and said interlevel dielectric layer.

10. The method of claim 1 wherein the planarization of said silicon nitride layer and said interlevel dielectric layer comprises chemical-mechanical polishing.

11. A method of annealing an oxide layer formed using an organosilicon source to prevent peeling after a planarization process, comprising:

a) providing a semiconductor structure with at least a cell area and a peripheral area; said peripheral area comprises an area selected from the group consisting of a wafer scribe area, a wafer edge, and a non-patterned area;

b) forming an interlevel dielectric layer composed of oxide, using a plasma enhanced chemical vapor deposition (PECVD) process; said interlevel dielectric layer is formed using an organosilicon source and having a thickness in a range of between about 8000 and 12,000 Å;

c) annealing said interlevel dielectric layer; the annealing of said interlevel dielectric layer is a rapid thermal anneal at a temperature in a range of between about 850 and 1015° C. for a time in a range of between about 10 and 50 seconds;

d) depositing a silicon nitride layer over said interlevel dielectric layer, said silicon nitride layer formed using a plasma enhanced chemical vapor deposition process; and e) planarizing said silicon nitride layer and said interlevel dielectric layer so to remove portions of said silicon nitride layer and said interlevel dielectric layer whereby the anneal of said interlevel layer prevents said silicon nitride layer and said interlevel dielectric layer from peeling.

12. The method of claim 11 wherein said organosilicon source comprises a material selected from the group consisting of TetraEthOxySilane, TetraEthylOrthoSilicate and TetraMethylCycloTraSiloxane (TMCTS).

13. The method of claim 11 wherein the planarization of said silicon nitride layer and said interlevel dielectric layer is a process selected from the group consisting of chemical-mechanical polish and etch back.

14. The method of claim 11 wherein the planarization of said silicon nitride layer and said interlevel dielectric layer comprises: forming a sacrificial layer composed of spin-on-glass over said silicon nitride layer; and etching back said sacrificial layer and said silicon nitride layer and said interlevel dielectric layer.

15. The method of claim 11 wherein the planarization of said silicon nitride layer and said interlevel dielectric layer comprises chemical-mechanical polishing.

16. A method of annealing an TEOS oxide layer to prevent peeling after a planarization process comprising:

a) providing a semiconductor structure with at least a cell area and a peripheral area; said peripheral area comprises an area selected from the group consisting of a wafer scribe area, a wafer edge, and a non-patterned area;

b) forming a first interlevel dielectric layer over said semiconductor structure, said first interlevel dielectric layer formed using a plasma enhanced chemical vapor deposition (PECVD) process with TetraEthylOrthoSilane having a thickness in a range of between about 500 and 2000 Å;

c) forming a second interlevel dielectric layer using a plasma enhanced chemical vapor deposition (PECVD) process with TetraEthylOrthoSilane (TEOS) having a thickness in a range of between about 1000 and 4000 Å;

d) forming a third interlevel dielectric layer composed of oxide, using a plasma enhanced chemical vapor deposition (PECVD) process using an organometallic source and having a thickness in a range of between about 8000 and 12,000 Å;

e) rapid thermal annealing said third interlevel dielectric layer at a temperature in a range of between about 850 and 1015° C. for a time in a range of between about 10 and 50 seconds;

f) depositing a silicon nitride layer over said third interlevel dielectric layer, said silicon nitride layer formed using a plasma enhanced chemical vapor deposition process; and g) planarizing said silicon nitride layer and said third interlevel dielectric layer so to remove portions of said silicon nitride layer and said interlevel dielectric layer.

17. The method of claim 16 wherein the planarization of said silicon nitride layer and said third interlevel dielectric layer is a process selected from the group consisting of chemical-mechanical polish and etch back.

18. The method of claim 16 wherein the planarization of said silicon nitride layer and said third interlevel dielectric layer comprises: forming a sacrificial layer composed of spin-on-glass over said silicon nitride layer; and etching back said sacrificial layer and said silicon nitride layer and said third interlevel dielectric layer.

19. The method of claim 16 wherein the planarization of said silicon nitride layer and said third interlevel dielectric layer comprises chemical-mechanical polishing.

* * * * *